(12) United States Patent
Chu et al.

(10) Patent No.: US 9,431,301 B1
(45) Date of Patent: Aug. 30, 2016

(54) NANOWIRE FIELD EFFECT TRANSISTOR (FET) AND METHOD FOR FABRICATING THE SAME

(71) Applicant: International Business Machines Corporation, Armonk, NY (US)

(72) Inventors: Jack O. Chu, Manhasset Hills, NY (US); Szu Lin Cheng, Hsin-Chu (TW); Isaac Lauer, Yorktown Heights, NY (US); Kuen-Ting Shiu, White Plains, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/964,968

(22) Filed: Dec. 10, 2015

(51) Int. Cl.
*H01L 21/336* (2006.01)
*H01L 21/8234* (2006.01)
(Continued)

(52) U.S. Cl.
CPC ... *H01L 21/823487* (2013.01); *H01L 21/0262* (2013.01); *H01L 21/02538* (2013.01); *H01L 21/02636* (2013.01); *H01L 21/283* (2013.01); *H01L 21/308* (2013.01); *H01L 21/3065* (2013.01); *H01L 21/32133* (2013.01); *H01L 21/762* (2013.01); *H01L 21/823412* (2013.01); *H01L 21/823431* (2013.01);
(Continued)

(58) Field of Classification Search
CPC .................. H01L 21/823431; H01L 21/762; H01L 21/02636; H01L 21/3065; H01L 21/02538; H01L 21/823487; H01L 29/7827; H01L 29/205; H01L 29/7849; H01L 29/66666; H01L 29/785; H01L 29/6681; H01L 29/6656
See application file for complete search history.

(56) References Cited

U.S. PATENT DOCUMENTS 7,893,492 B2   2/2011   Bedell et al.
8,722,472 B2   5/2014   Chang et al.
(Continued)

FOREIGN PATENT DOCUMENTS

WO   WO 2012/095651 A1   7/2012

OTHER PUBLICATIONS

Conrad et al., "Performance and Variability Studies of InGaAs Gate-all-Around Nanowire MOSFETs", IEEE Transactions on Device and Materials Reliability 13(4) pp. 489-496 (2013), Dec. 2012.
(Continued)

*Primary Examiner* — A. Sefer
(74) *Attorney, Agent, or Firm* — Scully, Scott, Murphy & Presser, P.C.; Louis J. Percello, Esq.

(57) ABSTRACT

A semiconductor structure includes a plurality of semiconductor fins located on a semiconductor substrate, in which each of the semiconductor fins comprises a sequential stack of a buffered layer including a III-V semiconductor material and a channel layer including a III-V semiconductor material. The semiconductor structure further includes a gap filler material surrounding the semiconductor fins and including a plurality of trenches therein. The released portions of the channel layers of the semiconductor fins located in the trenches constitute nanowire channels of the semiconductor structure, and opposing end portions of the channel layers of the semiconductor fins located outside of the trenches constitute a source region and a drain region of the semiconductor structure, respectively. In addition, the semiconductor structure further includes a plurality of gates structures located within the trenches that surround the nanowire channels in a gate all around configuration.

14 Claims, 12 Drawing Sheets

(51) Int. Cl.
| | |
|---|---|
| H01L 29/66 | (2006.01) |
| H01L 29/10 | (2006.01) |
| H01L 29/205 | (2006.01) |
| H01L 21/308 | (2006.01) |
| H01L 21/3065 | (2006.01) |
| H01L 21/283 | (2006.01) |
| H01L 21/3213 | (2006.01) |
| H01L 21/02 | (2006.01) |
| H01L 21/762 | (2006.01) |
| H01L 29/78 | (2006.01) |
| H01L 29/06 | (2006.01) |
| H01L 27/088 | (2006.01) |

(52) U.S. Cl.
CPC ........ *H01L 21/823468* (2013.01); *H01L 21/823481* (2013.01); *H01L 27/0886* (2013.01); *H01L 29/068* (2013.01); *H01L 29/0649* (2013.01); *H01L 29/0676* (2013.01); *H01L 29/1054* (2013.01); *H01L 29/205* (2013.01); *H01L 29/6656* (2013.01); *H01L 29/6681* (2013.01); *H01L 29/66666* (2013.01); *H01L 29/785* (2013.01); *H01L 29/7827* (2013.01); *H01L 29/7849* (2013.01)

(56) References Cited

U.S. PATENT DOCUMENTS

| | | | | |
|---|---|---|---|---|
| 9,224,866 | B2* | 12/2015 | Basu | H01L 29/785 |
| 2008/0224183 | A1* | 9/2008 | Nawaz | H01L 29/66795 |
| | | | | 257/279 |
| 2009/0294864 | A1* | 12/2009 | Suk | H01L 29/0673 |
| | | | | 257/368 |
| 2012/0138886 | A1 | 6/2012 | Kuhn et al. | |
| 2013/0230958 | A1* | 9/2013 | Lee | H01L 21/423431 |
| | | | | 438/283 |
| 2013/0270512 | A1 | 10/2013 | Radosavljevic et al. | |
| 2013/0341704 | A1* | 12/2013 | Rachmady | H01L 29/66545 |
| | | | | 257/327 |
| 2014/0001519 | A1* | 1/2014 | Dewey | H01L 29/66795 |
| | | | | 257/288 |
| 2014/0151638 | A1* | 6/2014 | Chang | H01L 29/42392 |
| | | | | 257/27 |
| 2014/0217362 | A1* | 8/2014 | Ma | H01L 29/7853 |
| | | | | 257/14 |
| 2014/0217364 | A1 | 8/2014 | Chang et al. | |
| 2014/0217502 | A1* | 8/2014 | Chang | H01L 29/78 |
| | | | | 257/347 |

OTHER PUBLICATIONS

Gu et al., "III-V gate-all-around nanowire MOSFET process technology: From 3D to 4D." in the Proceedings Digest of IEEE International Electron Devices Meeting (IEDM 2012) paper 23-7 (2012), Dec. 10-13, 2012.

Gu et al., "20-80nm Channel length InGaAs gate-all-around nanowire MOSFETs with EOT=1.2 nm and lowest SS=63mV/dec",. In IEEE International Electron Devices Meeting (IEDM 2012), paper# 27-6 (2012), Dec. 10-13, 2012.

Song et al., "III-V Junctionless Gate-All-Around Nanowire MOSFETs for High Linearity Low Power Applications", IEEE Electron Device Letters, vol. 35, No. 3, pp. 324-326 (2014), Mar. 2014.

Wu et al.,"InAs gate-all-around nanowire MOSFETs by top-down approach", 72nd Annual IEEE Device Research Conference (DRC), pp. 213-214 (2014), Jun. 22-25, 2014.

* cited by examiner

NANOWIRE FIELD EFFECT TRANSISTOR (FET) AND METHOD FOR FABRICATING THE SAME

BACKGROUND

The present invention relates to nanowire field effect transistor (FET) devices and more particularly, to techniques for fabricating a nanowire FET device using a replacement gate fin first, wire last process in order to form gate all around devices.

In its basic form, a field-effect transistor (FET) includes a source region, a drain region and a channel between the source and drain regions. A gate regulates electron flow through the channel that is between the source and drain regions.

Due to their superior electrostatics, gate all around nanowire channel field effect transistors (e.g., nanowire FETs) are expected to enable density scaling beyond current planar complementary metal oxide semiconductor (CMOS) technology. There are, however, notable challenges related to fabricating gate all around nanowire FETs, especially at scaled dimensions. For instance, in the conventional art, one difficulty with fabricating nanowire FETs is preserving the nanowire from damage during the fabrication process. Additionally, in a gate-first process flow, the gate material needs to be removed beneath the source/drain region of the device by some undercut method, which using conventional methods may also result in critical dimension loss of the gate line itself, potentially harming process and device scalability. Also, in wire-before-gate, gate-first or replacement gate processes, the nanowire must be suspended using a landing pad region, which may in turn harm layout efficiency.

SUMMARY

In accordance with an exemplary embodiment of the present disclosure, a method of forming a semiconductor structure is provided. The method includes forming a plurality of semiconductor fins on a top surface of a semiconductor substrate, in which at least one of the plurality of semiconductor fins includes a sequential stack of a buffered layer, a sacrificial layer and a channel layer located on a top surface of a semiconductor substrate. The buffered layer, the sacrificial layer and the channel layer each include a III-V semiconductor material. The method further includes forming a plurality of dummy gate structures straddling over a portion of the channel layer of the semiconductor fins at a location between a first end and a second end of the channel layer, and depositing a gap filler material surrounding the dummy gate structures. Further, the method includes removing the dummy gate structures to form a plurality of trenches in the gap filler material.

In addition, the method of the exemplary embodiment of the present disclosure further includes releasing a portion of the channel layer of the semiconductor fins located within the trenches by removing portions of the sacrificial layer located beneath the portion of the channel layer within the trenches to form nanowire channels of the semiconductor structure from the released portions of channel layer of the semiconductor fins.

In accordance with another exemplary embodiment of the present disclosure, a method of forming a semiconductor structure is provided. The method includes etching a plurality of semiconductor fins into a sequential stack of a buffered layer, a sacrificial layer and a channel layer located on a top surface of a semiconductor substrate, in which the buffered layer, the sacrificial layer and the channel layer each include a III-V semiconductor material and the semiconductor substrate includes silicon. The method further includes forming a plurality of dummy gate structures straddling over a portion of a channel region of the channel layer of the semiconductor fins, and performing a fin cut process to etch the channel layer of the semiconductor fins to form a plurality of patterned channel layer portions spaced apart from each other on the buffered layer of the semiconductor fins. Further, the method also includes performing an epitaxial growth process on the patterned channel layer portions of the semiconductor fins to transform the patterned channel layer portions into a continuous channel layer and to form a source region and a drain region on opposing ends of the continuous channel layer of the semiconductor fins. The method also includes depositing a gap filler material surrounding the dummy gate structures and removing the dummy gate structures to form a plurality of trenches in the gap filler material and exposing a top surface of portions of the continuous channel layer located within the trenches.

Furthermore, the method of the another exemplary embodiment of the present disclosure also includes releasing the portions of the continuous channel layer of the semiconductor fins located within the trenches by removing portions of the sacrificial layer from beneath the continuous channel layer within the trenches to form nanowire channels from the released continuous channel layer of the semiconductor fins, and forming a plurality of replacement gates within the trenches, that surround the nanowire channels and contact a top surface, sidewalls and a bottom surface of the nanowire channels.

In accordance with still another exemplary embodiment of the present disclosure, a semiconductor structure is provided. The semiconductor structure includes a plurality of semiconductor fins located on a semiconductor substrate, in which each of the semiconductor fins comprises a sequential stack of a buffered layer including a III-V semiconductor material and a channel layer including a III-V semiconductor material. The semiconductor structure further includes a gap filler material surrounding the semiconductor fins and including a plurality of trenches therein. The released portions of the channel layers of the semiconductor fins located in the trenches constitute nanowire channels of the semiconductor structure, and opposing end portions of the channel layers of the semiconductor fins located outside of the trenches constitute a source region and a drain region of the semiconductor structure, respectively. In addition, the semiconductor structure further includes a plurality of gate structures located within the trenches that surround the nanowire channels in a gate all around configuration.

DETAILED DESCRIPTION

Referring to FIGS. 1-14(c), there is shown a method of fabricating a semiconductor structure 1000 (e.g., a III-V gate all around nanowire field effect transistor (FET)).

Figure 1:
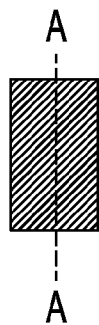
FIG. 1 is a cross-sectional view illustrating a starting platform for a nanowire field effect transistor fabrication process flow, i.e., a bulk semiconductor structure according to an embodiment of the present disclosure.
Figure 1:
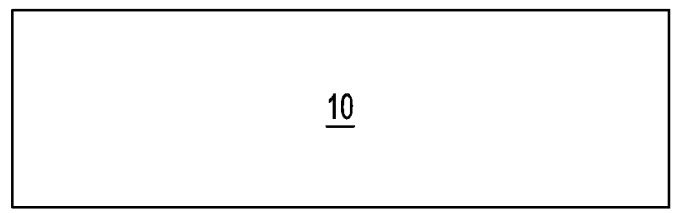

As shown in FIG. 1 the starting platform in this example is a bulk semiconductor substrate 10. The bulk semiconductor substrate 10 may be formed of any semiconductor material. For example, the semiconductor material of the bulk semiconductor substrate 10 can include silicon (Si), germanium (Ge), silicon germanium (SiGe), silicon germanium carbide (SiGeC), silicon carbide (SiC), a III-V compound semiconductor, a II-VI compound semiconductor or any combinations thereof. In the present embodiment, the bulk semiconductor substrate 10 includes silicon.

The semiconductor material need not be doped, although it may be very lightly doped as either N-type or P-type, without impacting the manufacturing process described herein. As used herein, P-type dopant refers to the addition of an impurity to the bulk semiconductor substrate 10 to create deficiencies of valence electrons. Examples of a P-type dopant include boron, aluminum, gallium or indium, any one or more of which may be added to the bulk semiconductor substrate 10. The N-type dopant refers to the addition of impurities to the bulk semiconductor substrate 10 which contribute more electrons to the semiconductor material (e.g., silicon) of the bulk semiconductor substrate 10, and may include (for instance) phosphorus, antimony or arsenic. By "lightly doped" it is meant a dopant concentration which may be, for example, less than or equal to $10^{16}$ cm$^{-3}$.

Alternatively, and in other embodiments, a silicon-on-insulator (SOI) substrate may be provided instead of a bulk semiconductor substrate 10.

Each of the figures illustrating the fabrication process will show a cross-sectional cut through a portion of the device structure. Thus a legend is provided at the top left corner of each figure illustrating the various orientations of the cuts shown. Specifically, by way of reference to the legend in FIG. 1, there is illustrated a cut taken along line A-A (the lengthwise direction of the bulk semiconductor substrate 10) through the bulk semiconductor substrate 10 of the device structure.

Figure 2:
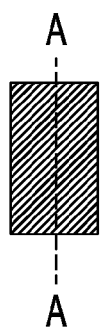
FIG. 2 is a cross-sectional view illustrating a sequential stack of a III-V buffered layer, a III-V sacrificial layer and a III-V channel layer having been formed on the bulk semiconductor substrate according to an embodiment of the present disclosure.
Figure 2:
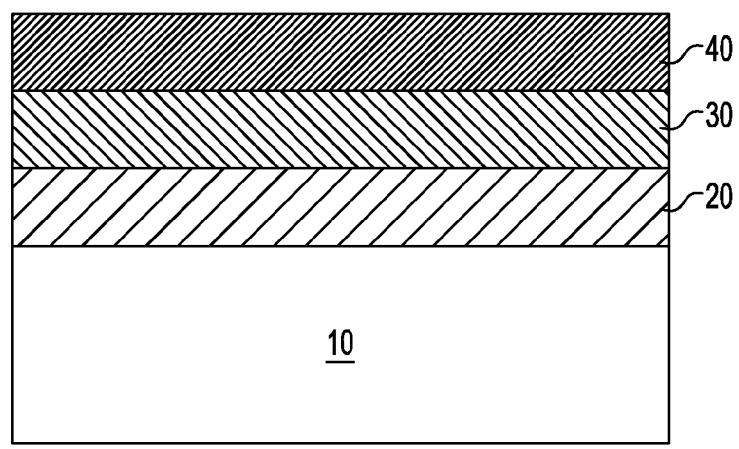

As shown in FIG. 2, a buffered layer 20, a sacrificial layer 30 and a channel layer 40 are then sequentially deposited layer by layer on a top surface of the bulk semiconductor substrate 10. The buffered layer 20 may be deposited on the top surface of the bulk semiconductor substrate 10 by, for example, a metal organic chemical vapor deposition (MOCVD) process or a molecular beam epitaxy (MBE) process. Moreover, the buffered layer 20 may include a III-V semiconductor material such as, for example, gallium arsenide (GaAs), indium gallium arsenide (InGaAs) or gallium phosphide (GaP). The thickness of the buffered layer 20 may be, for example, 0.5 µm to 5 µm.

The sacrificial layer 30 is then deposited on the top surface of the buffered layer 30 by for example, an MOCVD or MBE process. The sacrificial layer 30 includes a III-V semiconductor material such as, for example, indium phosphide (InP), indium aluminum arsenide (InAlAs), aluminum arsenide (AlAs) or a bi-layer stack of indium phosphide (InP)/indium aluminum arsenide (InAlAs). The thickness of the sacrificial layer 30 may be, for example, 0.1 µm to 1.0 µm.

The channel layer 40 is then deposited on the top surface of the sacrificial layer 30 by for example, an MOCVD or MBE process. The channel layer 40 includes a III-V semiconductor material such as, for example, indium gallium arsenide (InGaAs). The thickness of the channel layer 40 may be, for example, 5.0 nm to 100 nm.

Reference to the legend at the top left corner of FIG. 2 shows the orientation of the cross-sectional cut depicted in FIG. 2. Specifically, the orientation of the cross-sectional cut shown in FIG. 2 is taken along line A-A (the lengthwise direction of the bulk semiconductor substrate 10) through the channel layer 40, the sacrificial layer 30, the buffered layer 20 and the bulk semiconductor substrate of the device structure.

A plurality of semiconductor fin hardmasks 50 are then formed on the top surface of the channel layer 40. (See FIG. 3) The semiconductor fin hardmasks 50 may be formed by first depositing a hardmask material onto the top surface of the channel layer 40 using, for example, chemical vapor deposition (CVD), or plasma enhanced CVD (PECVD). The hardmask material may include, for example, a nitride such as silicon nitride. The deposited hardmask material is then patterned using conventional photolithography and etching techniques into a plurality of the individual semiconductor fin hardmasks 50. In one example, reactive ion etching (RIE) is used to form the semiconductor fin hardmasks 50.

Figure 3:
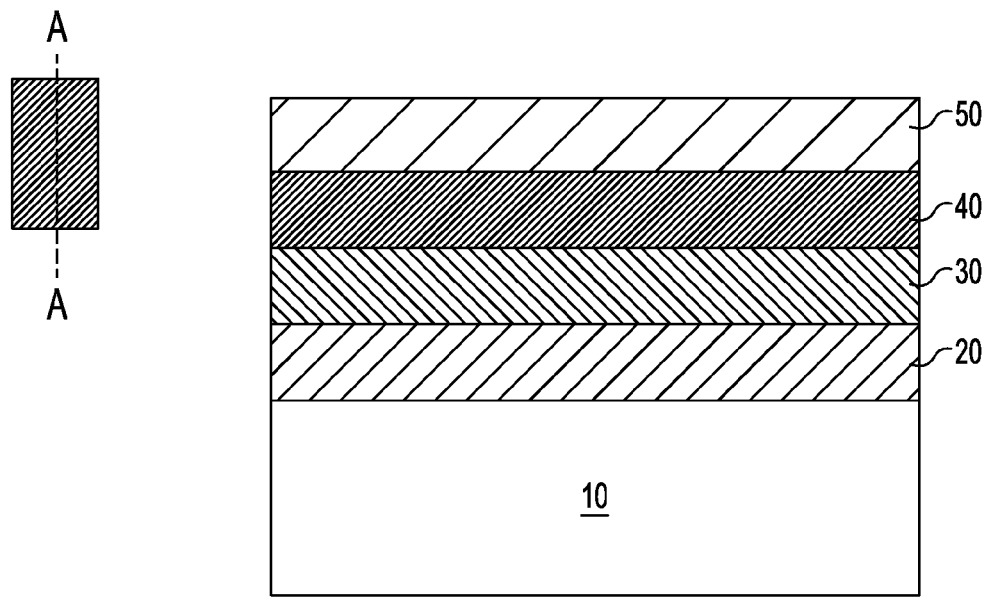
FIG. 3 is a cross-sectional view illustrating semiconductor fin hardmasks having been formed on the top surface of the III-V channel layer of the stack according to an embodiment of the present disclosure.

Reference to the legend at the top left corner of FIG. 3 shows the orientation of the cross-sectional cut depicted in FIG. 3. Specifically, the orientation of the cross-sectional cut shown in FIG. 3 is along line A-A (the lengthwise direction of the bulk semiconductor substrate 10) through the semiconductor fin hardmasks 50, the channel layer 40, the sacrificial layer 30, the buffered layer 20 and the bulk semiconductor substrate of the device structure.

A plurality of semiconductor fins 60 are then etched through the channel layer 40 and the sacrificial layer 30 and into the buffered layer 20 using the semiconductor fin hardmasks 50 as etching masks. (See FIGS. 4(a)-(b)). According to an exemplary embodiment, an etching process such as, for example, an RIE process is used to remove portions of the buffered layer 20, the sacrificial layer 30 and the channel layer 40 not masked by the semiconductor fin hardmasks 50 to form the semiconductor fins 60 on the top surface of the bulk semiconductor substrate 10. In the present embodiment, three semiconductor fins 60 are formed but exemplary embodiments of the present disclosure are not limited thereto. Alternatively, and in other embodiments, more than three semiconductor fins 60 or less than three semiconductor fins 60 may be formed.

Figure 4A:
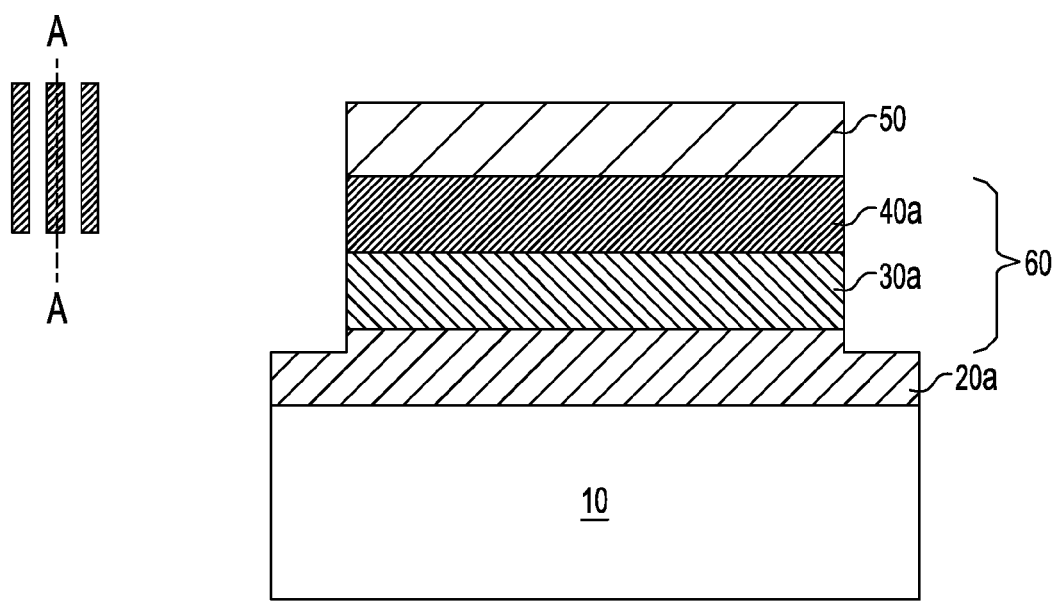
FIG. 4 (a) is a cross-sectional diagram illustrating semiconductor fins having been etched through the III-V channel layer and the III-V sacrificial layer and into the III-V buffered layer according to an embodiment of the present disclosure.
FIG. 4(b) is a cross-sectional diagram illustrating the semiconductor fins from another perspective, i.e., as a cross-sectional cut along the widthwise direction of the semiconductor fins of the device, according to an embodiment of the present disclosure.
Figure 4B:
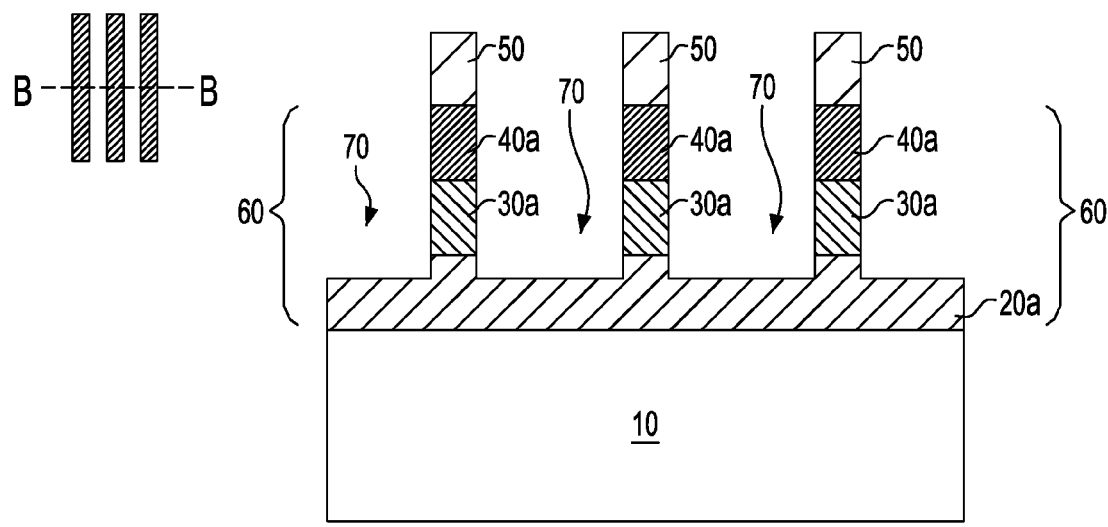

As shown in FIGS. 4(a)-(b), in forming the semiconductor fins 60, the buffered layer 20 is etched to a lesser extent in the present embodiment than the channel layer 40 and the sacrificial layer 30. Alternatively, and in other embodiments, in forming the semiconductor fins 60, the buffered layer 20 may not be etched at all but rather only the channel layer 40 and the sacrificial 30 are etched. For clarity, the buffered layer 20, the sacrificial layer 30 and the channel layer 40 following the fin etch are referred to as patterned buffered layer 20a, the patterned sacrificial layer 30a, and the patterned channel layer 40a.

Moreover, as shown in FIGS. 4(a)-4(b) each of the semiconductor fins 60 includes a sequential stack of a portion of the patterned buffer layer 20a, the patterned sacrificial layer 30a, and the patterned channel layer 40a. Furthermore, as shown in FIG. 4(b), the semiconductor hardmask 50 is located on the top surface of the patterned channel layer 40a of each of the semiconductor fins 60. In addition, a plurality of trenches 70 are defined in between the semiconductor fins 60 and on the sides of the semiconductor fins 60 as a result of the above-mentioned etch process to form the semiconductor fins 60.

Reference to the legend at the top left corner of FIG. 4(a) shows the orientation of the cross-sectional cut depicted in FIG. 4(a). Specifically, the orientation of the cross-sectional cut shown in FIG. 4(a) is taken along line A-A (the lengthwise direction of the semiconductor fins 60) through one of the semiconductor fins 60.

FIG. 4(b) depicts the semiconductor fins 60 from another perspective, i.e., as a cross-sectional cut taken along line B-B (the widthwise direction of the semiconductor fins 60) through each of the semiconductor fins 60 of the device structure (see the legend at the top left corner of FIG. 4(b) which shows the orientation of the cross-sectional cut depicted in FIG. 4(b)).

Figure 5:
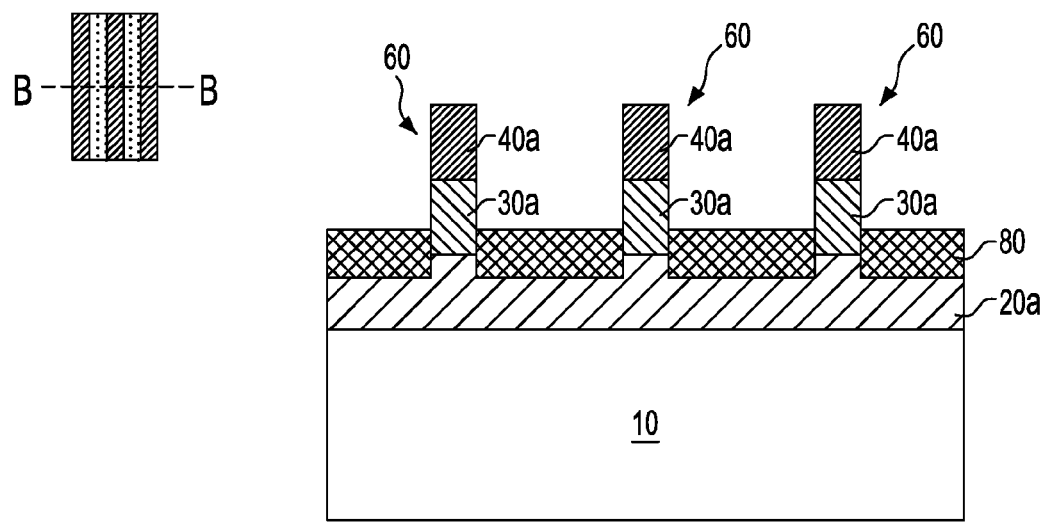
FIG. 5 is a cross-sectional diagram illustrating a recessed shallow trench isolation (STI) oxide having been formed around a lower portion of each of the semiconductor fins according to an embodiment of the present disclosure.

Referring now to FIG. 5, a shallow trench isolation (STI) oxide is then blanket deposited onto the device structure to cover the semiconductor fins 60 and completely fill each of the trenches 70. According to an exemplary embodiment, the STI oxide is deposited using, for example, a high-density plasma (HDP) CVD. A chemical mechanical polishing (CMP) process is then used to planarize the STI oxide using, for example, the semiconductor fin hardmasks 50 as an etch stop. Etching is then used to recess the STI oxide and expose a portion of each of the semiconductor fins 60 to form a recessed STI oxide 80 surrounding a base portion of each of the semiconductor fins 60. In addition, the recessed STI oxide partially fills the trenches 70. According to an exemplary embodiment, the STI oxide is recessed using, for example, a selective RIE. The semiconductor fin hardmasks 50 may then be removed using, for example a wet etching process or an RIE process. For example, in some embodiments, the semiconductor fin hardmasks 50 may be removed using hydrofluoric acid (HF) or heated phosphoric acid.

Reference to the legend at the top left corner of FIG. 5 shows the orientation of the cross-sectional cut depicted in FIG. 5. Specifically, the orientation of the cross-sectional cut shown in FIG. 5 is taken along line B-B (the widthwise direction of the semiconductor fins 60) through each of the semiconductor fins 60.

Processes are then performed on the device structure illustrated in FIG. 5 to form a plurality of dummy gate structures 100 each straddling the top surface and opposing sidewalls of a portion of each of the semiconductor fins 60 at a location in between the first end and second end of each of the semiconductor fins 60 as explained below in further detail in connection with FIGS. 6 and 7(*a*)-(*c*). In other words, the dummy gate structures 100 wrap around exposed portions of the semiconductor fins 60 (portions of the semiconductor fins 60 exposed after recess of the STI oxide is performed) located in between the first and second ends of each of the semiconductor fins 60 such as the top surface and sidewalls of the patterned channel layer 40*a* and a portion of an upper area of the sidewalls of the patterned sacrificial layer 30*a* of each of the semiconductor fins 60.

In the present embodiment, there are three dummy gate structures 100 but exemplary embodiments are not limited to any particular number of dummy gate structures. Alternatively, and in other exemplary embodiments, there may be only one or two dummy gate structures.

The dummy gate structures 100 each include a stack of a dummy gate dielectric layer 102 (e.g., a dummy oxide layer) and a dummy gate electrode 104 located on the dummy oxide layer 102. The dummy oxide layer 102 may be formed of, for example, a silicon-oxide based dielectric material such as silicon oxide, silicon oxynitride, silicon nitride, and/or a dielectric metal oxide having a dielectric constant greater than 8.0 and is known as a high-k material known in the art. The dummy gate electrodes 104 may be formed from, for example, a gate conductor material such as, for example, polycrystalline silicon.

Figure 6:
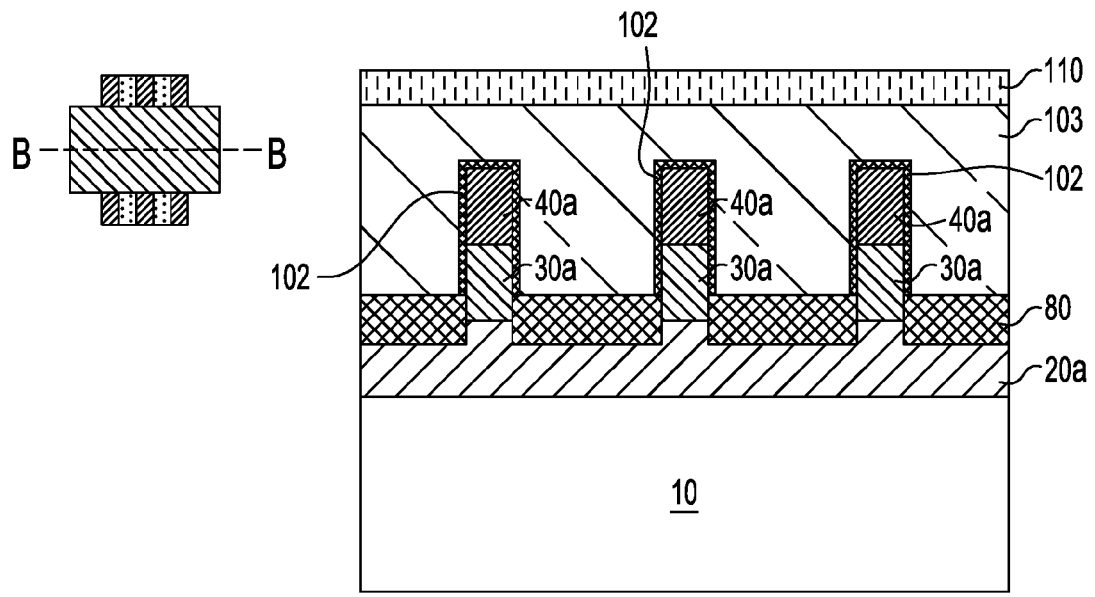
FIG. 6 is a cross-sectional diagram illustrating a dummy gate material having been deposited surrounding the semiconductor fins and dummy gate hardmasks having been formed on top of the dummy gate material according to an embodiment of the present disclosure.

Referring specifically to FIG. 6, the process for forming the dummy gate structures 100 may be begun by, for example, depositing a dummy oxide layer on exposed surfaces of the semiconductor fins 60 not covered by the recessed STI oxide 80. The dummy oxide layer 102 in the present embodiment, as shown in FIG. 6 is formed along the top surface and an upper portion of the sidewalls of each of the semiconductor fins 60. For example, in the present embodiment, the dummy oxide layer 102 covers the top surface and sidewalls of the patterned channel layer 40*a* and a portion of an upper area of the sidewalls of the patterned sacrificial layer 30*a* of each of the semiconductor fins 60. In other words, the dummy oxide layer 102 covers surfaces of each of the semiconductor fins 60 at a location in between the first and second ends of each of the semiconductor fins 60 which are not covered by the recessed STI oxides 80. The dummy oxide layer 102 may be formed on the semiconductor fins 60 using, for example, a plasma enhanced CVD (PECVD) or atomic layer deposition (ALD) process. Moreover, the dummy oxide layer 102 may have a thickness of, for example, 10 nm to 30 nm.

Further, as shown in FIG. 6, a dummy gate electrode layer 103 is then blanket deposited onto the bulk semiconductor substrate 10 covering each of the semiconductor fins 60 including the dummy oxide layer 102 located on each of the semiconductor fins 60. The dummy gate electrode layer 103 may be deposited by processes such as, for example, chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof.

Next, after depositing the dummy gate electrode layer 103, the dummy gate electrode layer 103 is then planarized using, for example, a CMP process. Dummy gate hardmasks 110 are then formed on the dummy gate electrode layer 103. See FIG. 6. The dummy gate hardmasks 110 may be formed of, for example, silicon nitride, silicon oxynitride (SiON), silicon carbide (SiC), silicon oxycarbide (SiOC), spin-on glass (SOG), a low-k film, tetraethylorthosilicate (TEOS), plasma enhanced CVD oxide (PE-oxide), or high-aspect-ratio-process (HARP) formed oxide.

For example, the dummy gate hardmasks 110 may be formed by first depositing a dummy hardmask layer (not shown) formed of a silicon nitride material on the dummy gate electrode layer 103 using, a CVD or PECVD process. The deposited dummy hardmask material may then be patterned using conventional photolithographic and etching processes known in the art to form the dummy gate hardmasks 110 on the top surface of the dummy gate electrode layer 103. For example, in the present embodiment, an RIE process is used to form the dummy gate hardmasks 110 on the top surface of the dummy gate electrode layer 103.

Reference to the legend at the top left corner of FIG. 6 shows the orientation of the cross-sectional cut depicted in FIG. 6. Specifically, the orientation of the cross-sectional cut shown in FIG. 6 is taken along line A-A (the widthwise direction of the semiconductor fins 60) through the dummy gate hardmasks 110, the dummy gate electrode layer 103, and the dummy oxide layer 102 and the semiconductor fins 60.

The dummy gate hardmasks 110 are then used to pattern the dummy gate electrode layer 103 to form a plurality of dummy gate structures 100 over the semiconductor fins 60 and separated from the semiconductor fins 60 by dummy oxide 102 of the dummy gate structures 100. See FIG. 7(*a*). Dummy gate structures 100 can be patterned using a polysilicon selective RIE around the dummy gate hardmasks 110. In the present embodiment, three dummy gate structures 100 are formed but exemplary embodiments of the present disclosure are not limited thereto. Alternatively, and in other embodiments, less than three dummy gate structures may be formed.

Figure 7A:
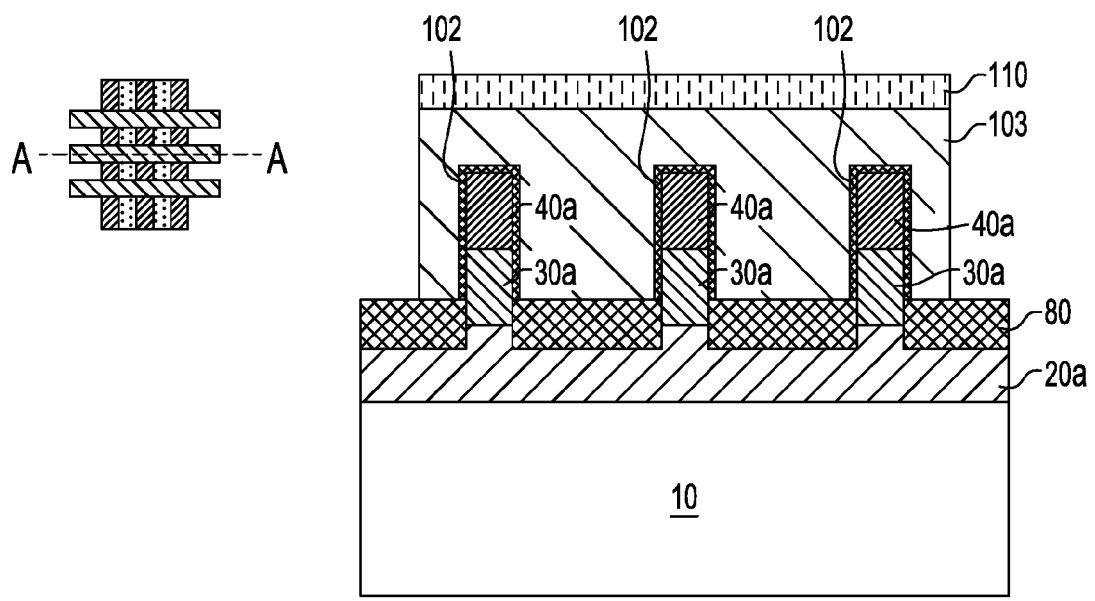
FIG. 7(a) is a cross-sectional diagram illustrating the dummy gate hardmasks having been used to pattern the dummy gate material into a plurality of individual dummy gate structures according to an embodiment of the present disclosure.
Figure 7B:
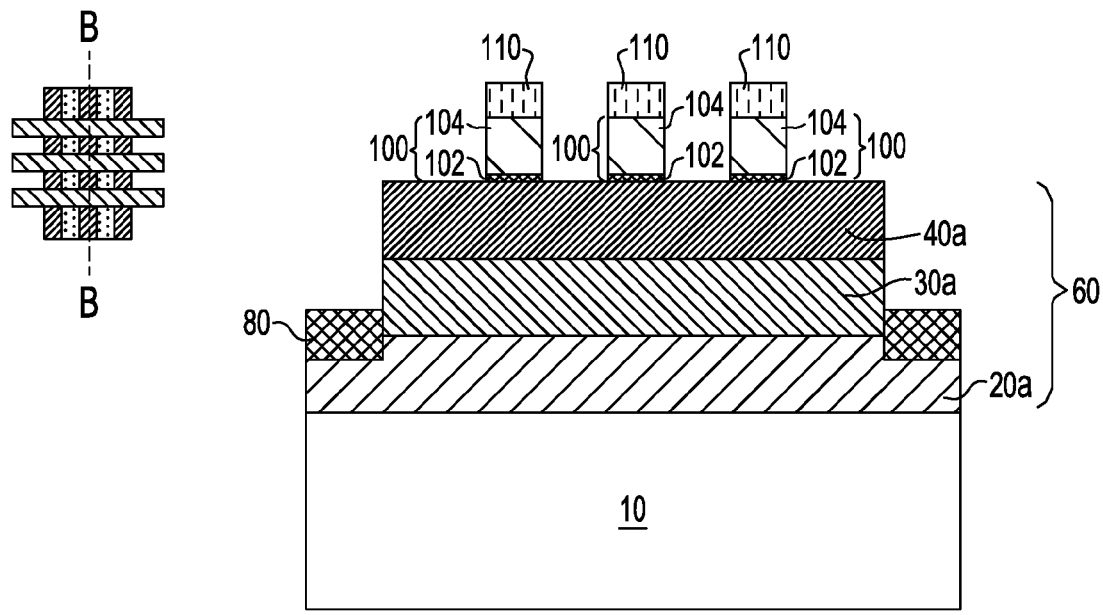
FIG. 7(b) is a cross-sectional view illustrating the patterning of the dummy gate structures from another perspective, i.e., as a cross-sectional cut along the lengthwise direction of semiconductor fins through one of the semiconductor fins and through each of the dummy gate structures, according to an embodiment of the present disclosure.
Figure 7C:
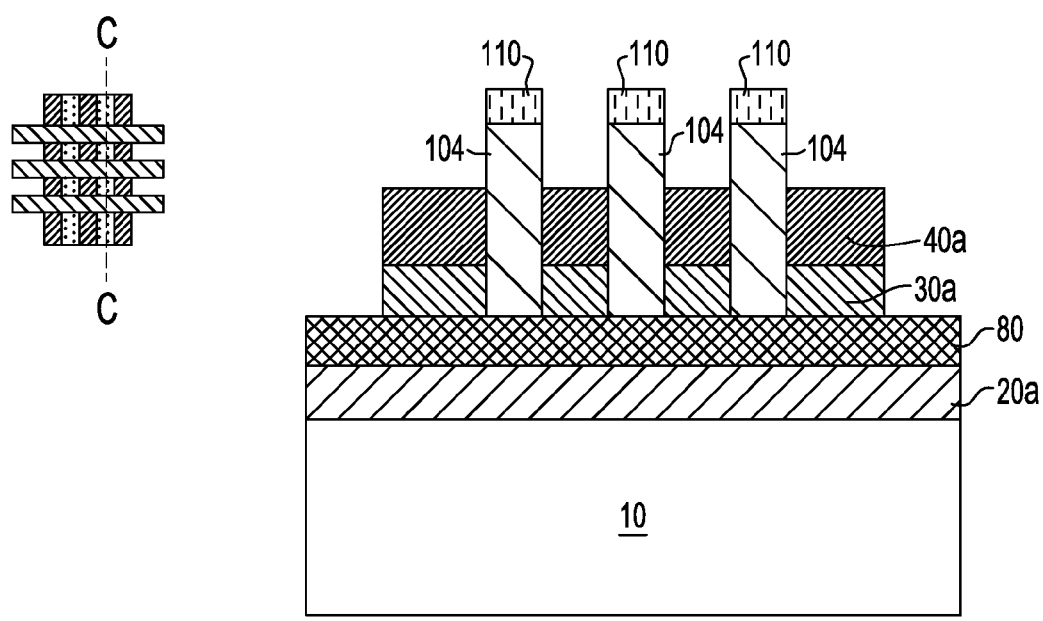
FIG. 7(c) is a cross-sectional view illustrating the patterning of the dummy gates from yet another perspective, i.e., as a cross-sectional cut along the lengthwise direction of the semiconductor fins through each of the dummy gate structures at a location between two of the semiconductor fins, according to an embodiment of the present disclosure.

Reference to the legend at the top left corner of FIG. 7(*a*) shows the orientation of the cross-sectional cut depicted in FIG. 7(*a*). Specifically, the orientation of the cross-sectional cut shown in FIG. 7(*a*) is taken along line A-A (the widthwise direction of the semiconductor fins 60) through one of dummy gate structures 100 and through each of the semiconductor fins 60.

FIG. 7(*b*) depicts the dummy gate structures 100 from another perspective, i.e., as a cross-sectional cut taken along line B-B (the lengthwise direction of the semiconductor fins 60) through one of the semiconductor fins 60 and through each of the dummy gate structures 100 of the device (see the legend at the top left corner of FIG. 7(*b*) which shows the orientation of the cross-sectional cut depicted in FIG. 7(*b*)).

FIG. 7(*c*) depicts the dummy gate structures 100 from yet another perspective, i.e., as a cross-sectional cut taken along line C-C (the lengthwise direction of semiconductor fins 60) through each of the dummy gates structures 100 at a location in between two of the semiconductor fins 60 of the device (see the legend at the top left corner of FIG. 7(*c*) which shows the orientation of the cross-sectional cut depicted in FIG. 7(*c*)).

Spacers 120 are then formed on opposing sidewalls of the dummy gate structures 100. See FIGS. 8(*a*)-(*b*). According to an exemplary embodiment, spacers 120 are formed by first depositing, for example, a nitride layer (not shown) onto the device structure illustrated in FIGS. 7(*a*)-(*c*) using, for example, a chemical vapor deposition (CVD) or an atomic layer deposition (ALD) process to cover the semiconductor fins 60. A resist film (not shown) is then deposited on the nitride layer, masked and patterned with a location and footprint of the spacers 120. A nitride-selective RIE is then used to define spacers 120 in the nitride layer on the sidewalls of each of the dummy gate structures 100 and on the sidewalls of each of the dummy hardmasks 110. The spacers 120 may have a thickness of, for example, 5 nm-25 nm.

Figure 8A:
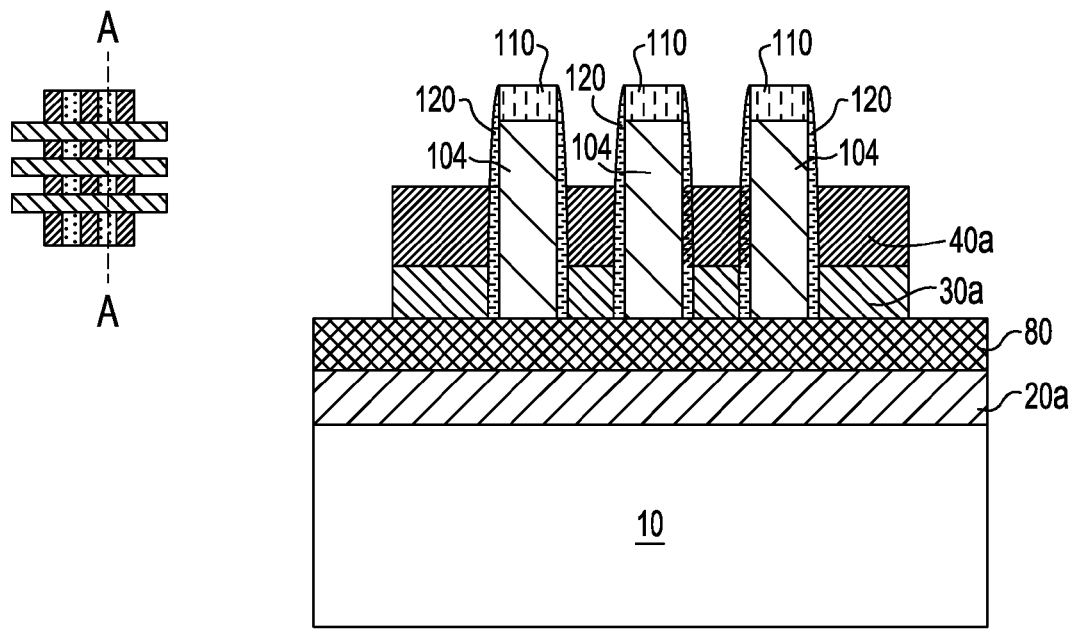
FIG. 8(a) is a cross-sectional view illustrating spacers having been formed on opposing sidewalls of the dummy gate structures according to an embodiment of the present disclosure.
Figure 8B:
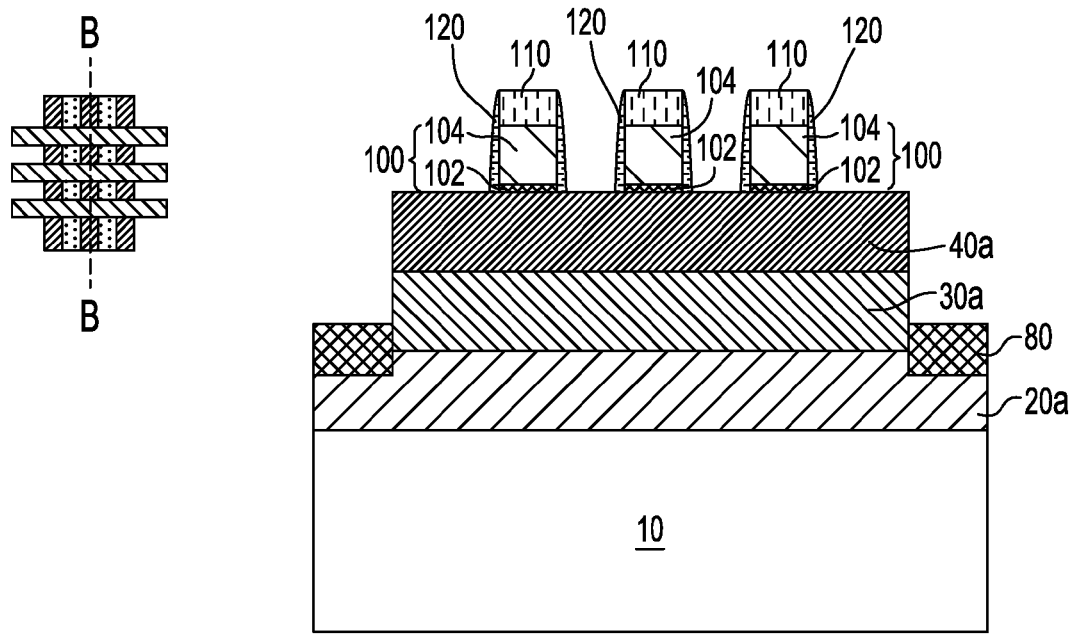
FIG. 8(b) is a cross-sectional view illustrating the spacers from another perspective, i.e., as a cross-sectional cut along the lengthwise direction of the semiconductor fins through one of the semiconductor fins and through each of the dummy gate structures, according to an embodiment of the present disclosure.

Reference to the legend at the top left corner of FIG. 8(*a*) shows the orientation of the cross-sectional cut depicted in FIG. 8(*a*). Specifically, the orientation of the cross-sectional cut shown in FIG. 8(*a*) is taken along line A-A (the lengthwise direction of the semiconductor fins 60) through each of the dummy gate structures 100 and a location in between two of the semiconductor fins 60.

Further, FIG. 8(*b*) depicts the spacers 120 from another perspective, i.e., as a cross-sectional cut taken along line B-B (the lengthwise direction of the semiconductor fins 60) through one of the semiconductor fins 60 and through each of the dummy gate structures 100 of the device (see the legend at the top left corner of FIG. 8(*b*) which shows the orientation of the cross-sectional cut depicted in FIG. 8(*b*)).

Figure 9A:
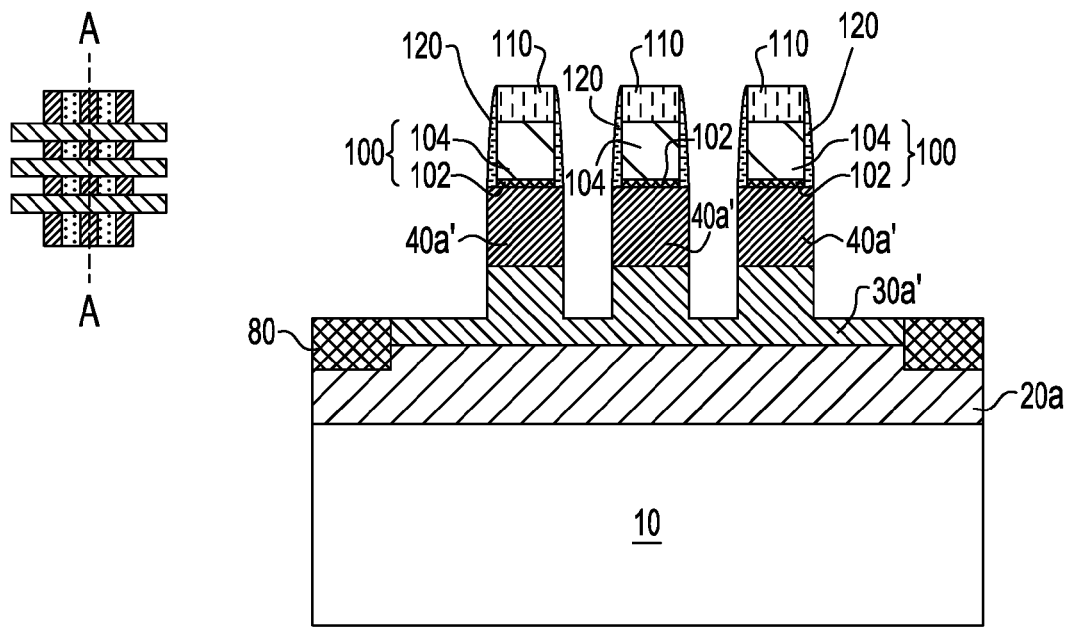
FIG. 9(a) is a cross-sectional view illustrating the semiconductor fin cut process, according to an embodiment of the present disclosure.
Figure 9B:
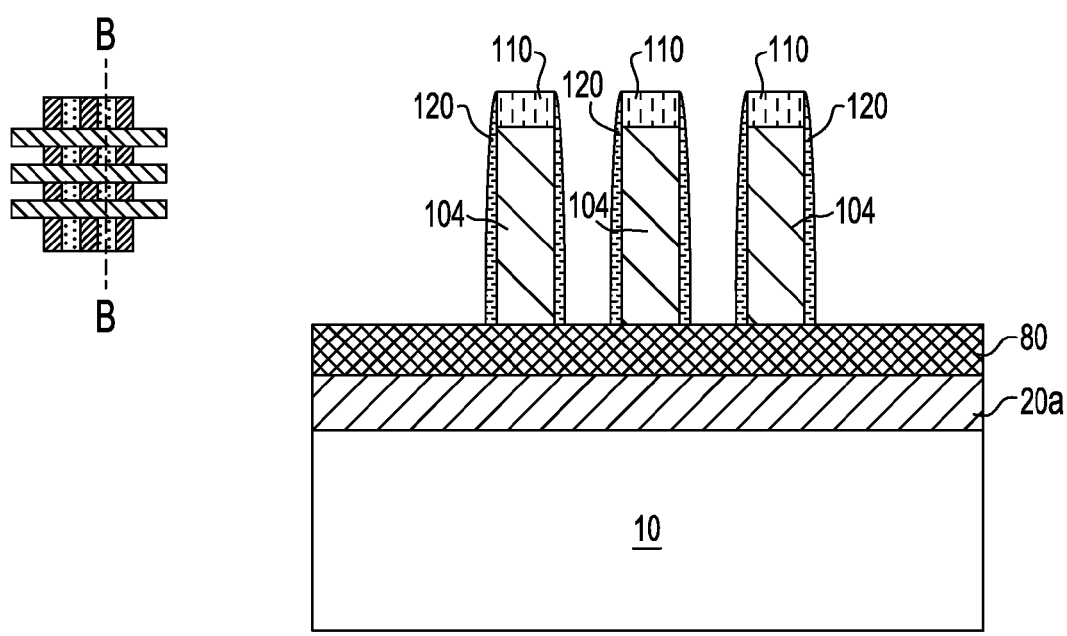
FIG. 9(b) is a cross-sectional view illustrating the semiconductor fin cut process from another perspective, i.e., as a cross-sectional cut along the lengthwise direction of the semiconductor fins through each of the dummy gate structures at a location between two of the semiconductor fins, according to an embodiment of the present disclosure.

Referring to FIG. 9(*a*)-(*b*), a fin cut process is then performed to etch away portions of the patterned channel layer 40*a* and the patterned sacrificial layer 30*a* of each of the semiconductor fins 60. The fin cut process may be performed, for example, using conventional photolithography and etching techniques such as, for example, using an RIE etching process and using the spacers 120 as an etching mask. As shown in FIG. 9(*a*), the patterned channel layer 40*a* is separated into a plurality of patterned channel layer portions 40*a'*, and the patterned sacrificial layer 30*a* is transformed into a recessed patterned sacrificial layer 30*a'* as a result of the above fin cut process. Although the figures only illustrate one of the semiconductor fins 60 (e.g., the middle semiconductor fin of the three semiconductor fins 60) having the patterned channel layer portions 40*a'* and the recessed patterned sacrificial layer 30*a*, it is noted that the patterned channel layers 40*a* and the patterned buffered layer 30*a* of the remaining two semiconductor fins 60 of the present embodiment are likewise also etched to transform the patterned channel layer 40*a* into patterned channel layer portions 40*a'* and to transform the patterned sacrificial layer 30*a* into the recessed patterned sacrificial layer 30*a'* in the same manner as for the semiconductor fin 60 depicted in FIG. 9(*a*).

Reference to the legend at the top left corner of FIG. 9(*a*) shows the orientation of the cross-sectional cut depicted in FIG. 9(*a*). Specifically, the orientation of the cross-sectional cut shown in FIG. 9(*a*) is taken along line A-A (the lengthwise direction of the semiconductor fins 60) through one of the semiconductor fins 60 and through each of the dummy gate structures 100.

Further, FIG. 9(*b*) depicts the semiconductor fin cut from another perspective, i.e., as a cross-sectional cut taken along line B-B (the lengthwise direction of the semiconductor fins 60) through each of the dummy gate structures 100 at a location in between two of the semiconductor fins 60 (see the legend at the top left corner of FIG. 9(*b*)).

Figure 10A:
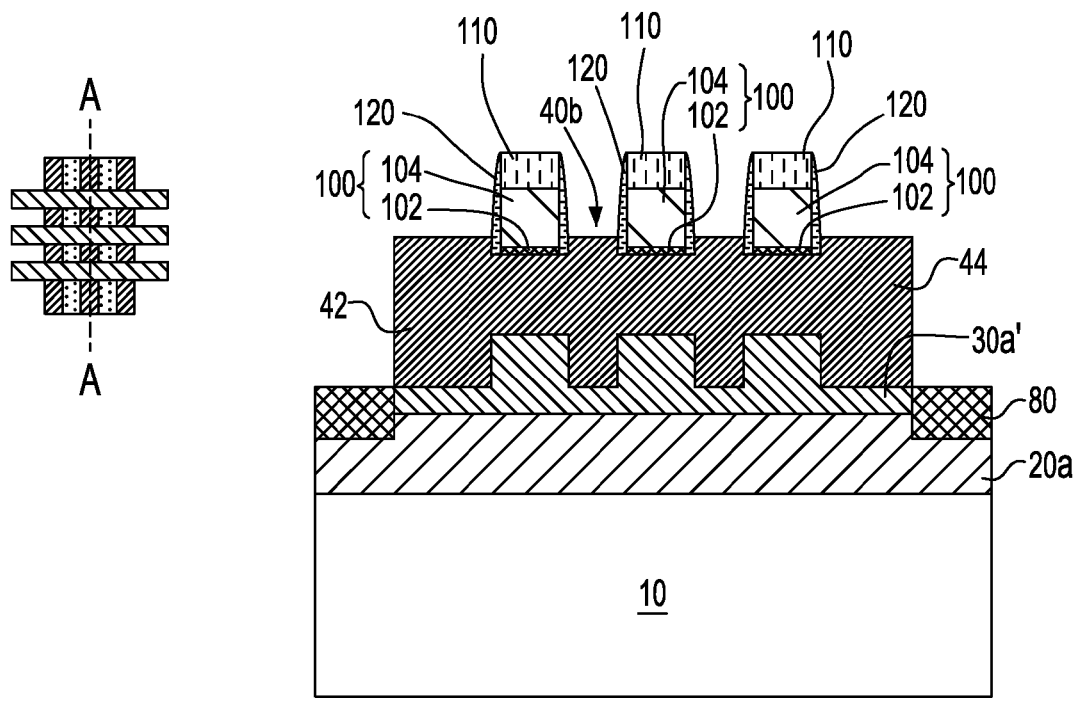
FIG. 10(a) is a cross-sectional view illustrating an epitaxial growth process for forming a source region and a drain region, according to an embodiment of the present disclosure.
Figure 10B:
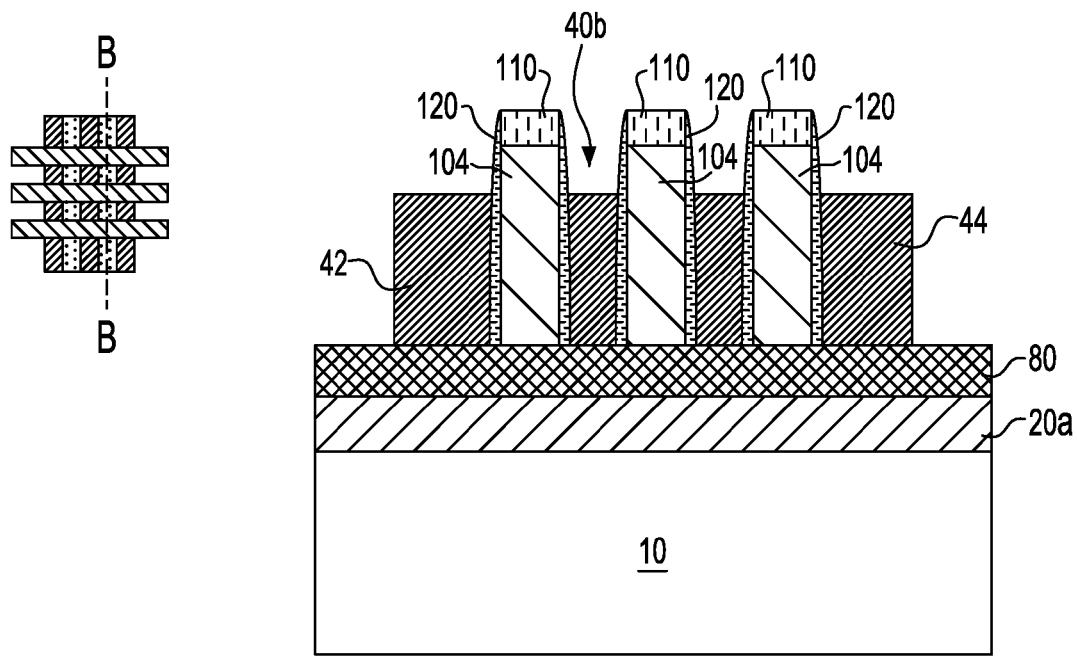
FIG. 10(b) a cross-sectional view illustrating the epitaxial process for forming the source region and the drain region from another perspective, i.e., as a cross-sectional cut along the lengthwise direction of the semiconductor fins through each of the dummy gate structures at a location between two of the semiconductor fins, according to an embodiment of the present disclosure.

Referring to FIGS. 10(*a*)-(*b*), an epitaxial growth process is then performed on the patterned channel layer portions 40*a'* of each of the semiconductor fins 60 of the device structure to laterally merge together each of the patterned channel layer portions 40*a'* of each of the semiconductor fin 60 to form a continuous channel layer 40*b*. In the present embodiment, the material used to epitaxially grow the continuous channel layer 40*b* is formed of, for example, the same material as the patterned channel layer portions 40*a'*. Although the figures only illustrate one of the semiconductor fins 60 (e.g., the middle semiconductor fin of the three semiconductor fins 60) having the continuous channel layer 40*b*, it is noted that the remaining two semiconductor fins 60 of the present embodiment now also include a continuous channel layer 40*b*. In other words, the above-mentioned epitaxial growth process is likewise performed on the patterned channel layer portions 40*a'* of each of the remaining two semiconductor fins 60 to form a continuous channel layer 40*b* in the same manner as depicted in FIGS. 10(*a*)-(*b*).

Moreover, a source region 42 and a drain region 44 may be formed on opposing ends of the continuous channel layer 40*b* of each of the semiconductor fins 60 by, for example, an in-situ doping process during the epitaxial growth process. Alternatively, and in another embodiment, an ion implantation process may be performed subsequently to the forming of the continuous channel layer 40*b* to form the source region 42 and the drain region 44 on opposing ends of the continuous channel layer 40*b* of each of the semiconductor fins 60. As shown in FIGS. 10(*a*)-(*b*), the dummy gate structure 100 straddles top and side surfaces of portions of the continuous channel layer 40*b* of each of the semiconductor fins 60. The portions of the continuous straddled by the dummy gate structures 100 will constitute the channel region of the final device structure.

Reference to the legend at the top left corner of FIG. 10(*a*) shows the orientation of the cross-sectional cut depicted in FIG. 10(*a*). Specifically, the orientation of the cross-sectional cut shown in FIG. 10(*a*) is taken along line A-A (the lengthwise direction of the semiconductor fins 60) through one of the semiconductor fins 60 and through each of the dummy gate structures 100.

Further, FIG. 10(*b*) depicts the continuous channel layer 40*b* of one of the semiconductor fins 60 from another perspective, i.e., as a cross-sectional cut taken along line B-B (the lengthwise direction of the semiconductor fins 60) through each of the dummy gate structures 100 at a location in between two of the semiconductor fins 60 (see the legend at the top left corner of FIG. 10(*b*) which shows that the orientation of the cross-sectional cut depicted in FIG. 10(*b*)).

Figure 11:
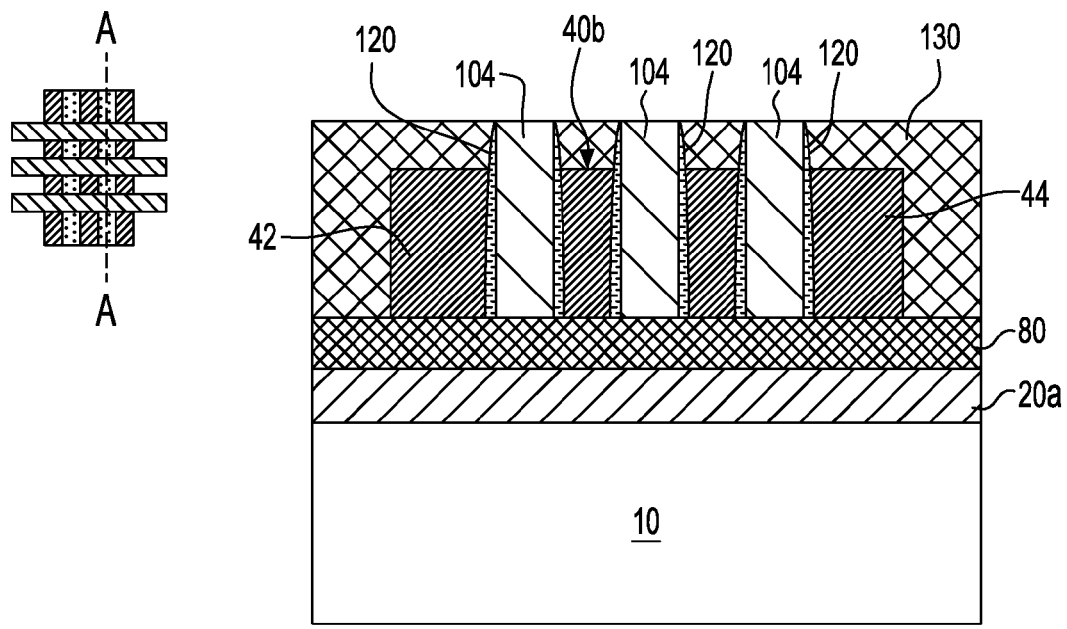
FIG. 11 is a cross-sectional view illustrating a gap filler material having been deposited onto the bulk semiconductor substrate, filling the spaces between the semiconductor fins and between the dummy gate structures according to an embodiment of the present disclosure.

Referring to FIG. 11, a gap filling process is then performed by depositing a gap filler material 130 onto the device structure illustrated in FIGS. 10(*a*)-(*b*) to fill the spaces between the semiconductor fins 60 and the dummy gate structures 100. A suitable gap filler material 130 includes, for example, silicon oxide. According to an exemplary embodiment, the gap filler material 130 is deposited using, for example, a high-density plasma (HDP) and then planarized down to the dummy gate structures 100 using a CMP process. Then, after planarization, the dummy hardmasks 110 may be removed. The dummy hardmasks may be removed by, for example, a wet etching (e.g., using hydrofluoric acid (HF) or heated phosphoric acid) or an RIE process. Alternatively, and in other embodiments, the planarization step may also serve to remove the dummy hardmasks 110.

Further, reference to the legend at the top left corner of FIG. 11 shows the orientation of the cross-sectional cut depicted in FIG. 11. Specifically, the orientation of the cross-sectional cut shown in FIG. 11 taken along line A-A (the lengthwise direction of the semiconductor fins 60) through each of the dummy gate structures 100 at a location in between two of the semiconductor fins 60.

Figure 12A:
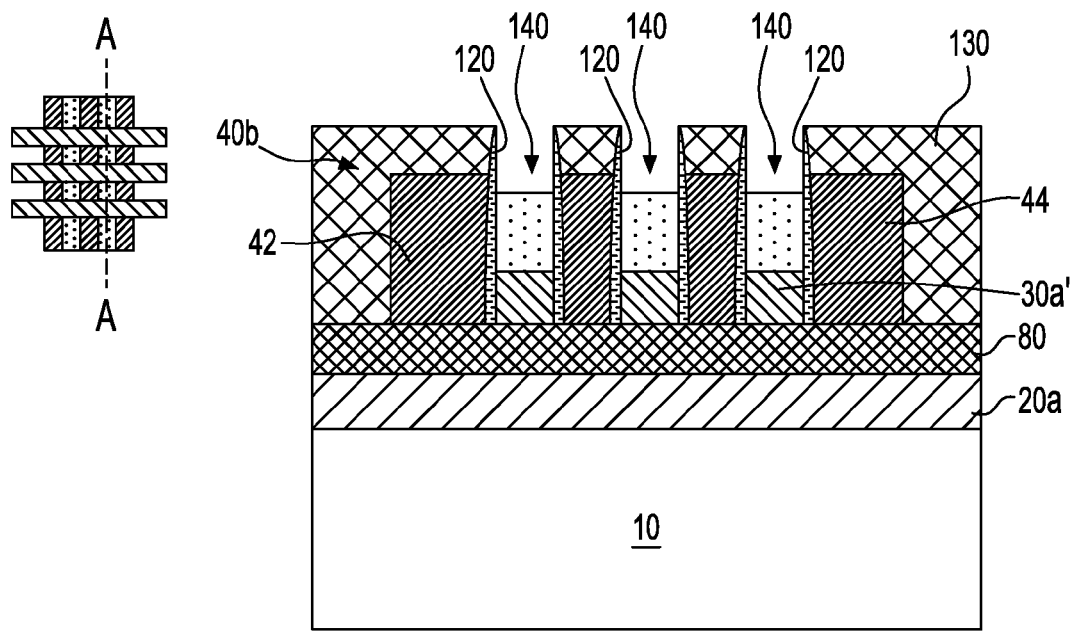
FIG. 12(a) is a cross-sectional view illustrating the dummy gate structures having been removed selective to the gap filler material according to an embodiment of the present disclosure.
Figure 12B:
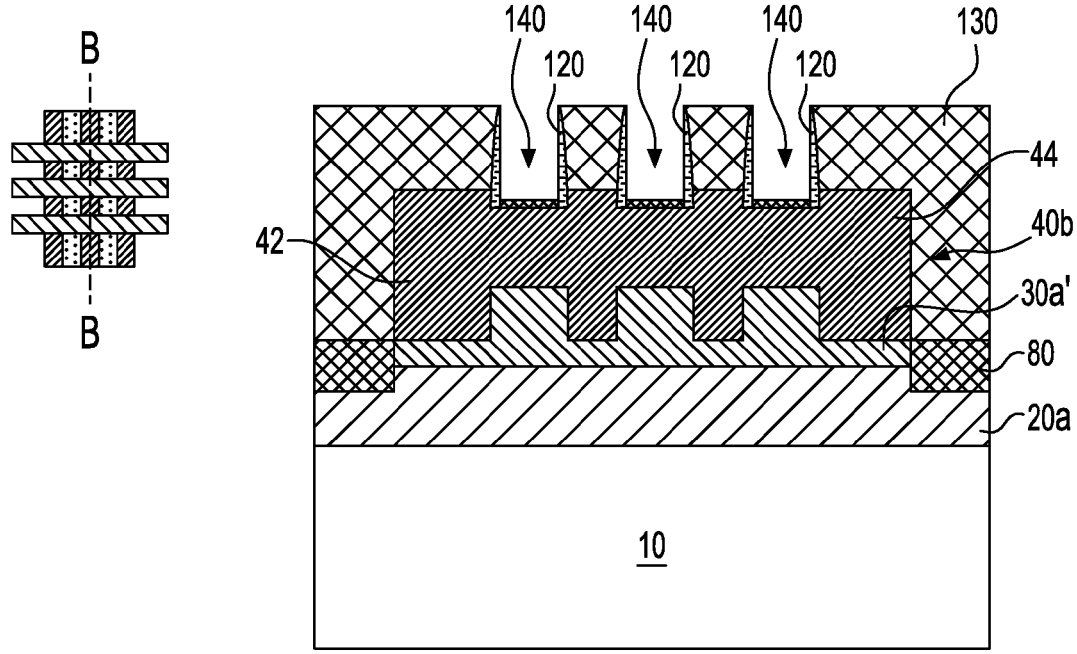
FIG. 12(b) is a cross-sectional view illustrating removal of the dummy gate structures from another perspective, i.e., as a cross-sectional cut along the lengthwise direction of the semiconductor fins through one of the semiconductor fins, according to an embodiment of the present disclosure.

As shown in FIGS. 12(a)-12(b), the dummy gate structures 100 are then removed selective to the gap filler material 130. According to an exemplary embodiment, dummy gate electrodes 100 are removed using a chemical etching process, such as, for example, a wet etching process (e.g., using potassium hydroxide (KOH)), or an RIE process. The dummy oxide 102 of the dummy gate structures 100 may be removed in a separate step after the dummy gate electrodes 104 have already been removed. By way of example only, the dummy gate structures 100 and the dummy oxide 102 could each be removed in a wet etching process using, for example, dilute hydrofluoric (HF) acid or an RIE process. The removal of the dummy gate structures 100 results in gate trenches 140 being formed in the gap filler material 130. According to an exemplary embodiment, gate trenches 140 distinguish a (nanowire) channel region of the device from the source regions 42 and the drain regions 44 of the device. In addition, as a result of the above-mentioned removal of the dummy gate structures 100, the top surface of channel regions of the continuous channel layer 40b are also exposed.

Reference to the legend at the top left corner of FIG. 12(a) shows the orientation of the cross-sectional cut depicted in FIG. 12(a). Specifically, the orientation of the cross-sectional cut shown in FIG. 12(a) is taken along line A-A (the lengthwise direction of the semiconductor fins 60) through each of the dummy gate structures 100 and in between two of the semiconductor fins 60.

FIG. 12(b) depicts the removal of the dummy gate structures 100 from another perspective, i.e., as a cross-sectional cut taken along line B-B (the lengthwise direction of the semiconductor fins 60) through one of the semiconductor fins 60 of the device (see the legend at the top left corner of FIG. 12(b)).

Figure 13A:
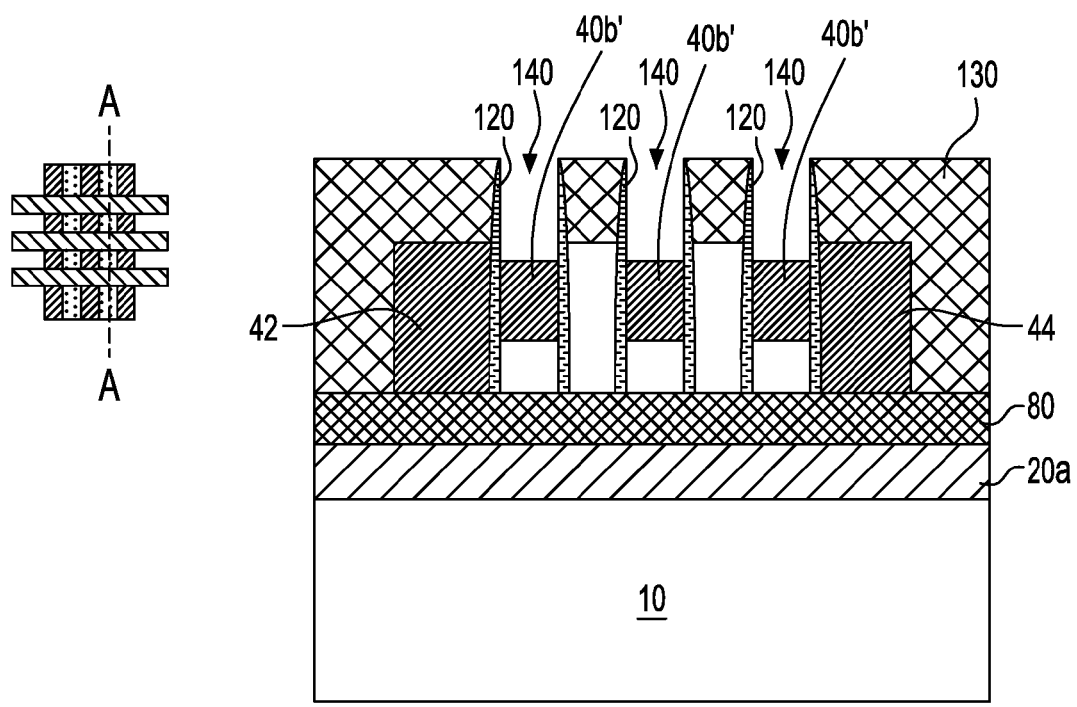
FIG. 13(a) is a cross-sectional view illustrating the nanowire channels having been released from the semiconductor fins by removing the sacrificial layer from the semiconductor fins according to an embodiment of the present disclosure.
Figure 13B:
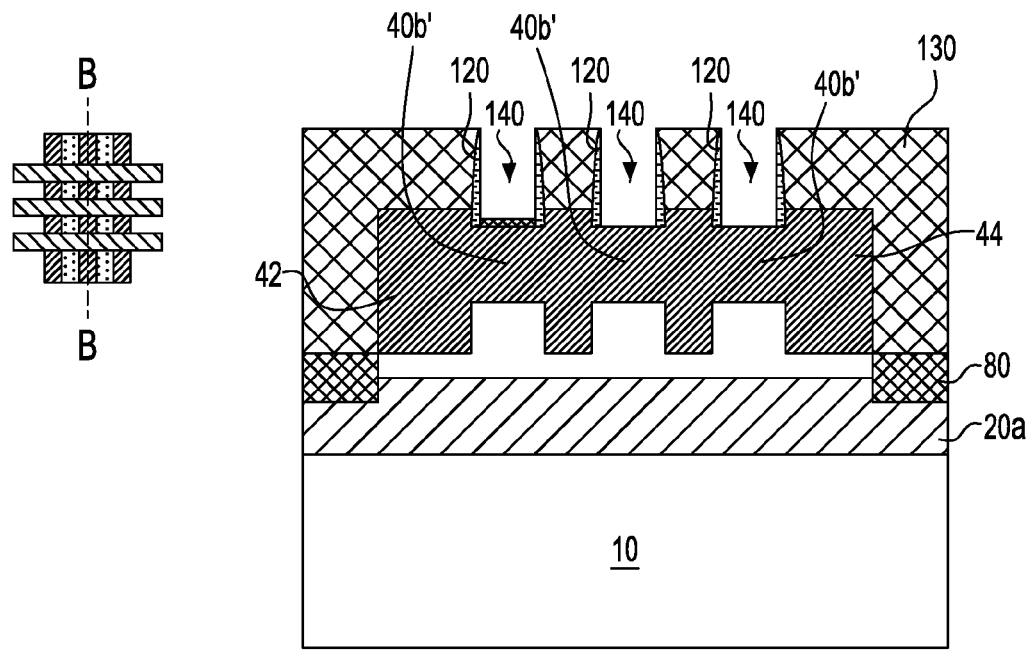
FIG. 13(b) is a cross-sectional view illustrating release of the nanowire channels from the semiconductor fins from another perspective, i.e., as a cross-sectional cut taken along the lengthwise direction of the semiconductor fins through one of the semiconductor fins and through one of the gate trenches formed by removal of the dummy gate structures according to an embodiment of the present disclosure.

Referring to FIGS. 13(a)-(b), a wire release process is then performed by removing the patterned sacrificial layer 30a located below the channel regions of the continuous channel layer 40b thereby exposing the bottom surface of the channel regions of the continuous channel layer 40b of the semiconductor fins 60. Consequently, after the wire release process the top surfaces and the bottom surfaces of the channel regions of the continuous channel layer 40b of each of the semiconductor fins 60 are exposed.

As provided above, the continuous channel layer 40b will be used to form nanowire channels of the device. In order to be able to form a gate (a replacement gate, see below) that surrounds the nanowire channels, the nanowire channels have to be released from the semiconductor fins 60. Namely, the patterned sacrificial layer 30a located beneath the continuous channel layer 40b is removed from each of the semiconductor fins 60, resulting in suspended nanowire channels 40b' formed from the suspended portions of the continuous channel layers 40b located within the gate trenches 140. See FIGS. 13(a)-(b). In other words, the portions of the continuous channel layer 40b released from the semiconductor fins 60 within the gate trenches 140 by the above-mentioned wire release process are now referred to hereinafter as nanowire channels 40b'. The source region 42 and the drain region 44 of each the semiconductor fins 60 located outside of the gate trenches 140 are connected to each other by the nanowire channels 40b'.

The patterned sacrificial layer 30a may be removed from each of the semiconductor fins 60 using, for example, a wet etching process. In the present embodiment, a wet etching process using, for example, hydrochloric acid (HCL) is used to perform the wire release process.

Reference to the legend at the top left corner of FIG. 13(a) shows the orientation of the cross-sectional cut depicted in FIG. 13(a). Specifically, the orientation of the cross-sectional cut shown in FIG. 13(a) is taken along line A-A (the lengthwise direction of the semiconductor fins 60) at a location in between two of the semiconductor fins 60 of the device.

FIG. 13(b) depicts the release of the nanowire channels from the semiconductor fins from another perspective, i.e., as a cross-sectional cut taken along line B-B (the lengthwise direction of the semiconductor fins 60) through one of the semiconductor fins 60 and through one of the trenches formed by removal of the dummy gate structures 100 (see the legend at the top left corner of FIG. 13(b) which shows the orientation of the cross-sectional cut depicted in FIG. 13(b)).

Figure 14A:
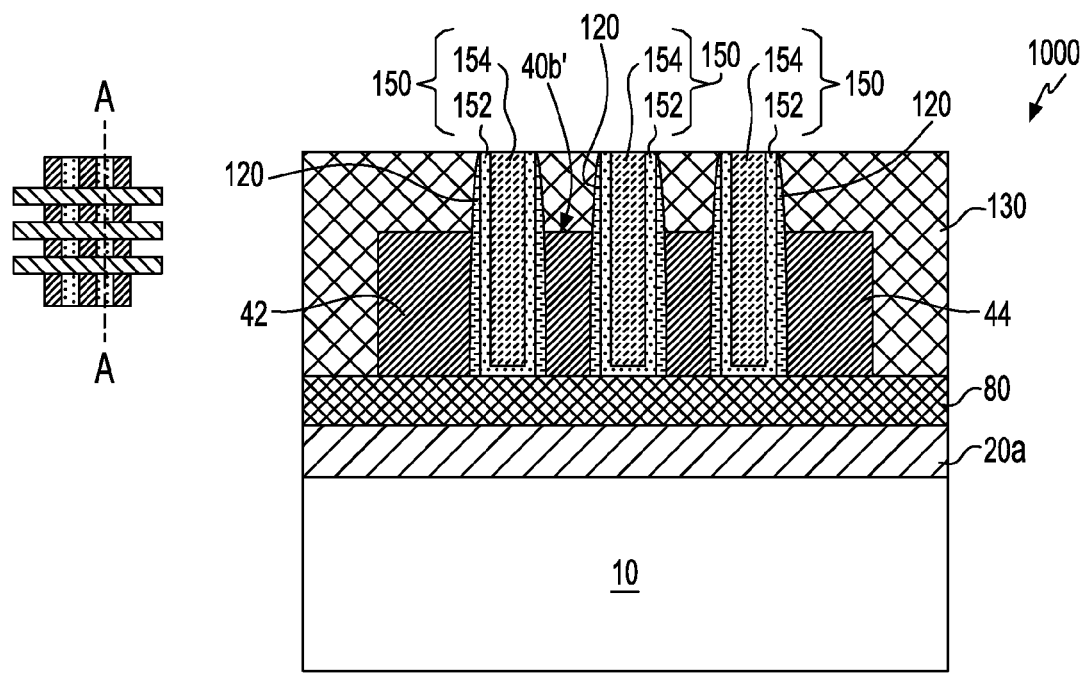
FIG. 14 (a) is a cross-sectional view illustrating replacement gates having been formed in the gate trenches formed by removal of the dummy gate structures to form the semiconductor structure according to an embodiment of the present disclosure.
FIG. 14(b) is a cross-sectional view illustrating the formation of the replacement gates from another perspective, i.e., as a cross-sectional cut along the lengthwise direction of the semiconductor fins through one of the semiconductor fins and through each of the replacement gate structures according to an embodiment of the present disclosure.
FIG. 14(c) is a cross-sectional view illustrating the formation of the replacement gates from yet another perspective, i.e., as a cross-sectional cut along the widthwise direction of the semiconductor fins through each of the semiconductor fins and through one of the replacement gate structures according to an embodiment of the present disclosure.
Figure 14B:
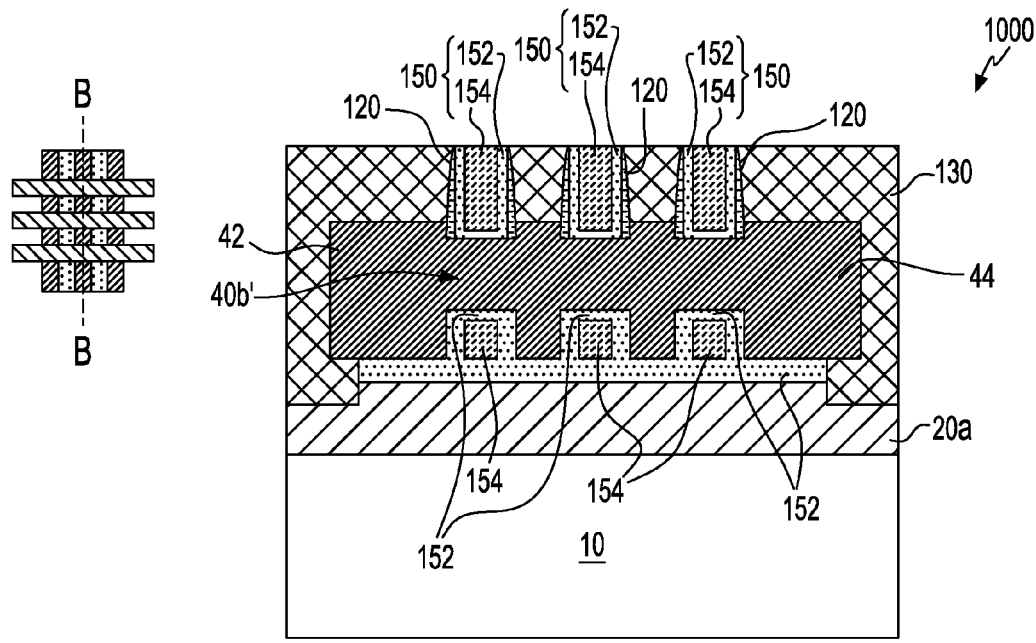
Figure 14C:
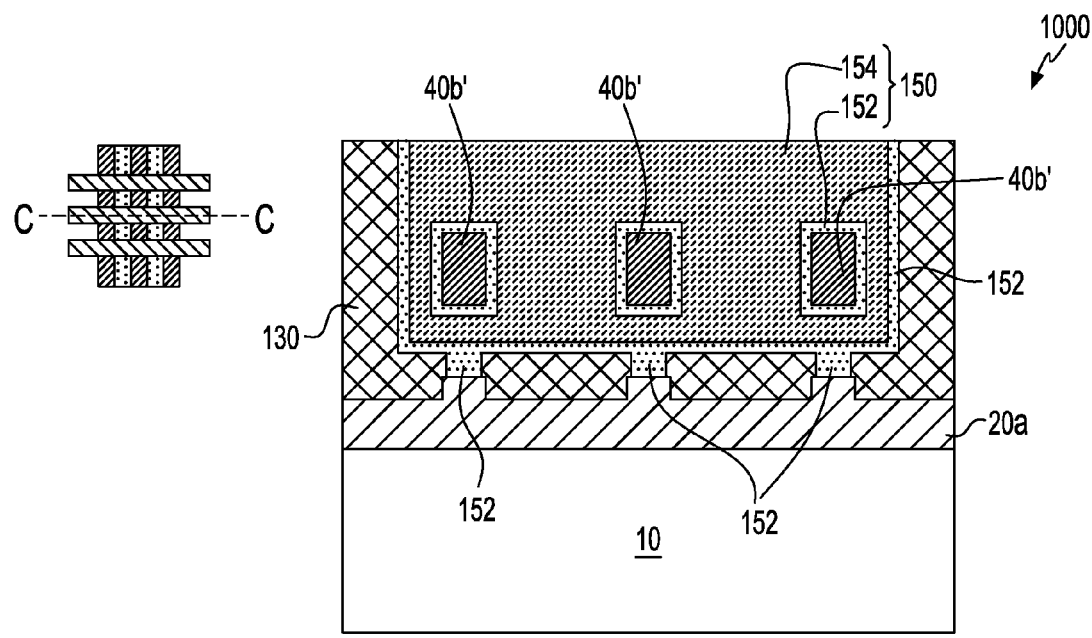

Referring to FIGS. 14(a)-(c), a gate stack deposition process is then performed to fill the gaps in the gate trenches 140 of the device structure illustrated in FIGS. 13(a)-(b) created by removal of the dummy gate structures 100 and by the removal of the patterned sacrificial layer 30a from each of the semiconductor fins 60. In particular, replacement gate structures 150 are formed in the gate trenches 140 surrounding the nanowire channels 40b' in a gate all around configuration thereby forming the semiconductor structure 1000. See FIGS. 14(a)-(c). By gate all around configuration, it is meant that each of the replacement gate structures 150 contacts the top surface, the sidewalls and the bottom surface of each the nanowire channels 40b' of the semiconductor structure 1000.

The replacement gate structures 150 each include a stack of a gate dielectric layer 152 and a gate electrode 154 located on the gate dielectric layer 152. More specifically, the gate dielectric layer 152 of the replacement gates 150 surrounds and contacts the top surface, the sidewalls and the bottom surface of the nanowire channels 40b' of the semiconductor structure 1000. Moreover, the replacement gate structures 150 are formed by first depositing a gate dielectric layer 152 in the gate trenches 140 surrounding the nanowire channels 40b'. According to an exemplary embodiment, the gate dielectric layer 152 may be formed of, for example, a silicon-oxide based dielectric material such as silicon oxide, silicon oxynitride, silicon nitride, and/or a dielectric metal oxide having a dielectric constant greater than 8.0 and is known as a high-k material known in the art. The gate dielectric layer 152 may be deposited using a deposition process such as, for example, atomic layer deposition (ALD).

A gate material (not shown) is then deposited on top of the gate dielectric layer 152 in the gate trenches 140 to fill the gate trenches 140, and then CMP is used to planarize the gate material to form the replacement gate structures 150 filling the gate trenches 140 and surrounding the nanowire channels to thereby form the semiconductor device structure 1000. In other words, the nanowire channels 40b' are surrounded by the dielectric gate layer 152 of the replacement gate structures 150 and separated from the bulk semiconductor substrate 10. Suitable gate materials include, but are not limited to polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials.

In the present embodiment, the semiconductor structure 1000 is, for example, a III-V gate all around nanowire FET.

Reference to the legend at the top left corner of FIG. 14(*a*) shows the orientation of the cross-sectional cut depicted in FIG. 14(*a*). Specifically, the orientation of the cross-sectional cut shown in FIG. 14(*a*) is taken along line A-A (the lengthwise direction of the semiconductor fins 60) through each of the replacement gate structures 150.

FIG. 14(*b*) depicts the formation of the semiconductor structure 1000 from another perspective, i.e., as a cross-sectional cut taken along line B-B (the lengthwise direction of the semiconductor fins 60) through one of the semiconductor fins 60 and each of the replacement gate structures 150 of the semiconductor structure 1000 (see the legend at the top left corner of FIG. 14(*b*) which shows the orientation of the cross-sectional cut depicted in FIG. 14(*b*)).

FIG. 14(*c*) depicts the formation of the semiconductor structure 1000 from yet another perspective, i.e., as a cross-sectional cut taken along line C-C (the widthwise direction of the semiconductor fins 60) through one of the replacement gate structures 150 and each of the semiconductor fins 60 of the semiconductor structure 1000 (see the legend at the top left corner of FIG. 14(*c*) which shows the orientation of the cross-sectional cut depicted in FIG. 14(*c*)).

With exemplary embodiments of the present disclosure, processes are provided for forming III-V gate all around FETs which avoid the difficulties encountered by conventional processes for forming the nanowire FET by delaying nanowire suspension until near the end of the front-end-of-line (FEOL) process. With processes of exemplary embodiment, a replacement gate fin FET process is employed in which an additional release layer is added at the beginning of the process. Only after the dummy gate structures are removed is the nanowire channel released, such that the nanowire once formed only needs to see the wire release and the gate deposition steps. For the rest of the process, the nanowire exists as a part of the semiconductor fin, or fully encapsulated in the gate. Thus, the integrity of the nanowire is protected throughout the majority of the process.

In addition, with exemplary embodiments of the present disclosure, integration of high-quality III-V nanowire FETs on a semiconductor substrate (e.g., silicon substrate) are achieved. For instance, with exemplary embodiments, the III-V channel used to form the semiconductor fins and later to form the nanowire channels is achieved by planar heteroepitaxy with the III-V buffer layer (used to form the semiconductor fins), which in turn can significantly reduce crystal defect density below 1e7/cm2 (as compared to at least ~1e9/cm2 for conventional III-V/Si in normal practice). Meanwhile, the introduction of III-V sacrificial layer with exemplary embodiments further enhances crystal quality by eliminating the defect propagation from the III-V buffered layer to III-V channel layer, therefore translating to significant reduction of OFF-state leakage current of the FETs (one of the main hurdles for III-V FETs made with conventional semiconductor processes).

Furthermore, with exemplary embodiments of the present disclosure, the channel layer used to form the nanowire channels is made of a III-V semiconductor material in contrast to the conventional art which focuses on forming the nanowire channels made of silicon or silicon germanium. III-V semiconductor material have significantly higher electron mobility than silicon or silicon germanium materials. Consequently, devices of exemplary embodiments including nanowire channels formed of III-V semiconductor material may operate at significantly lower drive voltages (as low as half the drive voltage) than the drive voltage used to operate conventional devices which include nanowire channels formed of silicon or silicon germanium.

While the present application has been described in terms of specific embodiments, it is evident in view of the foregoing description that numerous alternatives, modifications and variations will be apparent to those skilled in the art. Each of the various embodiments of the present application can be implemented alone, or in combination with any other embodiments of the present application unless expressly disclosed otherwise or otherwise impossible as would be known to one of ordinary skill in the art. Accordingly, the present application is intended to encompass all such alternatives, modifications and variations which fall within the scope and spirit of the present application and the following claims.

What is claimed is:

1. A method of forming a semiconductor structure, comprising:
   forming a plurality of semiconductor fins on a top surface of a semiconductor substrate, wherein at least one of the plurality of semiconductor fins includes a sequential stack of a buffered layer, a sacrificial layer and a channel layer located on a top surface of a semiconductor substrate, wherein the buffered layer, the sacrificial layer and the channel layer each include a III-V semiconductor material;
   forming a plurality of dummy gate structures straddling over a portion of the channel layer of the semiconductor fins at a location between a first end and a second end of the channel layer, wherein prior to forming said plurality of dummy gate structures, an epitaxial growth process is performed on the channel layer of the semiconductor fins to form a source region and a drain region in the first end and the second end of the channel layer, respectively;
   depositing a gap filler material surrounding the dummy gate structures;
   removing the dummy gate structures to form a plurality of trenches in the gap filler material; and
   releasing a portion of the channel layer of the semiconductor fins located within the trenches by removing portions of the sacrificial layer located beneath the portion of the channel layer within the trenches to form nanowire channels of the semiconductor structure from the released portions of channel layer of the semiconductor fins.

2. The method of claim 1, further comprising forming a plurality of replacement gate structures within the trenches, that surround the nanowire channels of the semiconductor structure in a gate all around configuration.

3. The method of claim 1, wherein the semiconductor substrate includes silicon, wherein the buffered layer includes one of gallium arsenide (GaAs), indium gallium arsenide (InGaAs), gallium phosphide (GaP), wherein the sacrificial layer includes of indium phosphide (InP), indium aluminum arsenide (InAlAs), aluminum arsenide (AlAs), or a bilayer of indium phosphide (InP)/indium aluminum arsenide (InAlAs) and wherein the channel layer includes indium gallium arsenide (InGaAs).

4. The method of claim 1, wherein the buffered layer, the sacrificial layer and the channel layer are each deposited using one of metal organic chemical vapor deposition (MOCVD) or molecular beam epitaxy (MBE).

5. A method of forming a semiconductor structure, comprising:
   etching a plurality of semiconductor fins into a sequential stack of buffered layer, a sacrificial layer and a channel layer located on a top surface of a semiconductor substrate, wherein the buffered layer, the sacrificial layer and the channel layer each include a III-V semiconductor material and wherein the semiconductor substrate includes silicon;
   forming a plurality of dummy gate structures straddling over a portion of a channel region of the channel layer of the semiconductor fins;
   performing a fin cut process to etch the channel layer of the semiconductor fins to form a plurality of patterned channel layer portions spaced apart from each other on the buffered layer of the semiconductor fins;
   performing an epitaxial growth process on the patterned channel layer portions of the semiconductor fins to transform the patterned channel layer portions into a continuous channel layer and to form a source region and a drain region on opposing ends of the continuous channel layer of the semiconductor fins;
   depositing a gap filler material surrounding the dummy gate structures;
   removing the dummy gate structures to form a plurality of trenches in the gap filler material and exposing a top surface of portions of the continuous channel layer located within the trenches;
   releasing the portions of the continuous channel layer of the semiconductor fins located within the trenches by removing portions of the sacrificial layer from beneath the continuous channel layer within the trenches to form nanowire channels from the released continuous channel layer of the semiconductor fins; and
   forming a plurality of replacement gates within the trenches, that surround the nanowire channels and contact a top surface, sidewalls and a bottom surface of the nanowire channels.

6. The method of claim 5, wherein the buffered layer includes one of gallium arsenide (GaAs), indium gallium arsenide (InGaAs), gallium phosphide (GaP), wherein the sacrificial layer includes of indium phosphide (InP), indium aluminum arsenide (InAlAs), aluminum arsenide (AlAs), or a bilayer of indium phosphide (InP)/indium aluminum arsenide (InAlAs) and wherein the channel layer includes indium gallium arsenide (InGaAs).

7. The method of claim 6, wherein the forming of the semiconductor fins comprises:
   depositing the buffered layer on the top surface of the semiconductor substrate;
   depositing the sacrificial layer on the top surface of the buffered layer;
   depositing the channel layer on a top surface of the sacrificial layer;
   forming a plurality of semiconductor hardmasks on a top surface of the channel layer; and
   etching the semiconductor fins into the channel layer, the sacrificial layer, and the buffered layer using a reactive ion etching (RIE) process and using the semiconductor hardmasks as an etching mask.

8. The method of claim 7, wherein the buffered layer, the sacrificial layer and the channel layer are deposited using one of metal organic chemical vapor deposition (MOCVD) or molecular beam epitaxy (MBE).

9. The method of claim 6, wherein in forming the semiconductor fins, the buffered layer is etched less than the channel layer and the sacrificial layer.

10. The method of claim 6, wherein the semiconductor substrate is a bulk semiconductor substrate, and wherein prior to forming the dummy gate structures, the method further comprises forming a recessed shallow trench isolation (STI) oxide surrounding a base portion of the semiconductor fins.

11. The method of claim 10, wherein the recessed STI oxide is formed by the steps comprising:
   depositing an STI oxide on the bulk semiconductor substrate and covering the semiconductor fins;
   planarizing the STI oxide using a chemical mechanical polishing process (CMP);
   etching the STI oxide to recess the STI oxide and expose a portion of the semiconductor fins; and
   removing the semiconductor fin hardmasks.

12. The method of claim 10, wherein the forming of the dummy gate structures comprises:
   forming a dummy gate material surrounding portions of the semiconductor fins not covered by the recessed STI oxide;
   planarizing the dummy gate material;
   forming a plurality of dummy gate hardmasks on the top surface of the planarized dummy gate material; and
   patterning the dummy gate material using the dummy gate hardmasks as an etching mask to form the dummy gate structures.

13. The method of claim 5, further comprising:
   forming spacers on opposite sidewalls of the dummy gate structures.

14. The method of claim 5, wherein the fin cut process further comprises etching the buffered layer to form a patterned buffered layer having recesses therein that is located beneath the plurality of patterned channel layer portions.

* * * * *